United States Patent
Yves

(10) Patent No.: US 8,673,656 B2
(45) Date of Patent: Mar. 18, 2014

(54) METHOD AND DEVICE FOR MEASURING TEMPERATURE DURING DEPOSITION OF SEMICONDUCTOR

(75) Inventor: Lacroix Yves, Tokushima (JP)

(73) Assignee: YSystems, Ltd., Tokushima (JP)

( * ) Notice: Subject to any disclaimer, the term of this patent is extended or adjusted under 35 U.S.C. 154(b) by 165 days.

(21) Appl. No.: 13/146,307

(22) PCT Filed: Dec. 26, 2008

(86) PCT No.: PCT/JP2008/073702
§ 371 (c)(1),
(2), (4) Date: Jul. 26, 2011

(87) PCT Pub. No.: WO2010/073358
PCT Pub. Date: Jul. 1, 2010

(65) Prior Publication Data
US 2011/0312107 A1    Dec. 22, 2011

(51) Int. Cl.
*G01R 31/26* (2006.01)
*H01L 21/66* (2006.01)

(52) U.S. Cl.
USPC ........... 438/14; 438/16; 257/E21.53; 374/161

(58) Field of Classification Search
None
See application file for complete search history.

(56) References Cited

U.S. PATENT DOCUMENTS

| | | | | |
|---|---|---|---|---|
| 4,890,933 A | * | 1/1990 | Amith et al. | 374/121 |
| 6,116,779 A | * | 9/2000 | Johnson et al. | 374/161 |
| 2008/0173898 A1 | * | 7/2008 | Ohmaki | 257/194 |

FOREIGN PATENT DOCUMENTS

| | | |
|---|---|---|
| JP | 04-247637 | 9/1992 |
| JP | 2001-289714 | 10/2001 |
| JP | 2002-122480 | 4/2002 |
| JP | 2002-367907 | 12/2002 |

OTHER PUBLICATIONS

International Search Report and Written Opinion, International Application No. PCT/JP2008/073702, Dec. 26, 2008.

* cited by examiner

*Primary Examiner* — Daniel Whalen
*Assistant Examiner* — Shaka White
(74) *Attorney, Agent, or Firm* — Brinks Gilson & Lione

(57) ABSTRACT

Provided is a method and a device for measuring a temperature which can recognize the temperature of a semiconductor layer directly with high precision when the semiconductor layer is formed by deposition. The quantity of laser light transmitted to a semiconductor layer is monitored by a photodetector by using laser light having a wavelength $\lambda s$ at which the transmittance of light changes abruptly when the temperature of the semiconductor layer reaches Ts during or after deposition. When heat being given to the semiconductor layer is changed, the quantity of laser light monitored by the photodetector changes abruptly when the temperature of the semiconductor layer reaches Ts at a time A, B or C. Consequently, the fact that the temperature of the semiconductor layer reached Ts at a time A, B or C can be recognized exactly, and an error in temperature information observed by a device for measuring temperature variations can be calibrated, for example.

3 Claims, 4 Drawing Sheets

(A)

(B)

METHOD AND DEVICE FOR MEASURING TEMPERATURE DURING DEPOSITION OF SEMICONDUCTOR

The present application is the national phase application of PCT Application No. PCT/JP2008/073702, filed Dec. 26, 2008, the entirety of which is hereby incorporated by reference.

TECHNICAL FIELD

The present invention relates to a method and a device for measuring the temperature of a semiconductor layer with high precision during or after deposition of the semiconductor. The semiconductor part of a light-emitting diode or other device structure layer temperature is determined at the time when that temperature is attained during or after the layer is formed by deposition.

BACKGROUND ART

Such semiconductors as AlN, GaAs, GaN, InP, Si, SiC can be formed by deposition. For the deposition, such processes as chemical vapor deposition (CVD) or molecular beam epitaxy (MBE) are applied. In these deposition processes, a semiconductor film is formed in such a manner that a substrate is placed in a chamber in a heated state, to which source molecules are supplied, in a state of gas, to the surface to form a crystal layer on the surface of the substrate.

For these kinds of deposition processes, it is necessary to accurately control the temperature of the substrate in the chamber in order to prepare a crystal layer of intrinsic semiconductors, at a constant deposition rate, precisely, and with reproducibility. For these purposes, a heater is provided to heat the substrate, and also a monitoring device is used to measure the temperature of the substrate in the chamber, so that the heater is set based on a temperature measured by the monitor.

As described in Patent Literature 1 and Patent Literature 2, a pyrometer which watches infra-red rays emitted from heat of the substrate surface has been conventionally used as the monitor. The pyrometer is installed outside the window provided on the chamber, and infra-red rays emitted from the surface of the substrate or the surface of the semiconductor layer during the deposition are detected by the pyrometer through the glass window. Temperature monitoring by the pyrometer, however, raises the following problems.

When the infra-red rays emitted from the surface of heated substrate pass through the semiconductor layer during the film deposition process, the light passing through and the light reflected inside the semiconductor layer interfere with each other, causing fluctuation of detection output of the pyrometer. Moreover, the degree of the interference varies with the change of the film thickness of the semiconductor layer being formed. This problem has been conventionally solved in such a manner that a light emitting device is disposed outside the chamber, and the light is reflected on the semiconductor layer being deposited through the transparent window of the chamber, and the reflected light is monitored. Since the light reflecting on the semiconductor layer surface is reflected, it also interferes with the light reflected inside the semiconductor layer, as with the case of infra-red rays. The amount of light emission offset due to the interference can thus be determined, and a calibration of the infrared emission is possible, reducing the fluctuations in temperature measured by the pyrometer.

However, even if the interference of the infra-red rays detected by the pyrometer is calibrated, the temperature monitoring by the pyrometer is carried out at a place away from the surface of the substrate, generally outside the glass window of the chamber. A long distance exists between the actually heat-generating surface of the substrate and the monitoring spot, also via the glass window, and therefore, it is unavoidable to produce an error between the temperature detected by the pyrometer and the actual temperature at the surface of the substrate.

Moreover, in case the semiconductor layer and its substrate are transparent, the pyrometer really monitors the temperature of the chamber's substrate holder surface via the transparent semiconductor layer. Thus, it is difficult to detect the temperature of the semiconductor layer being deposited, directly and accurately, by such a measuring method as using a pyrometer.

Patent Literature 1 discloses also use of a thermocouple monitor to detect the temperature on the rear side of the substrate. However, since the thermocouple monitor is disposed on the rear side of the substrate, actual temperature on the surface of the substrate cannot be measured accurately. Moreover, since the heat capacity of thermocouple monitor is large, follow-up to temperature change in the chamber is not adequately made, and therefore, it is not possible to know the substrate temperature accurately.

[Patent Literature 1]
Japanese Unexamined Patent Application Publication No. 2001-289714
[Patent Literature 2]
Japanese Unexamined Patent Application Publication No. 2002-367907

DISCLOSURE OF THE INVENTION

Technical Problem

The present invention intends to solve the conventional problems, aiming at providing a method and a device for measuring temperature during deposition of semiconductor which are able to detect, at high precision, temperature of the semiconductor layer at the surface of the substrate during or after the film deposition and able to prepare semiconductor layer of high quality.

Solution to Problem

The present invention is characterized by a method for measuring the temperature of a semiconductor layer during or after deposition which is formed on a substrate under being heated in a chamber by source molecules supplied to the chamber.

The relationship between the temperature Ts of the semiconductor layer and the wavelength λs of monochromatic light being transmitted through the layer, at the time when the transmittance of the light passing through the semiconductor layer decreases in the process of raising the temperature of the semiconductor layer is known beforehand.

The semiconductor layer is irradiated with light having a wavelength λs during or after deposition. The temperature of the substrate is decreased, and when the transmittance of the light having a wavelength λs has increased, the semiconductor layer is judged to have reached the temperature Ts. Similarly, when the temperature of the substrate is increased and the transmittance of the light having a wavelength λs has decreased, the semiconductor layer is judged to have reached the temperature Ts.

The present invention can be applied to a device for continuously measuring temperature variations of the substrate. The temperature Td measured by the device for measuring temperature variations is compared with the temperature Ts at the time when the temperature of the semiconductor layer is judged to have reached the temperature Ts, and based on the difference, measurement error by the device for measuring temperature variations can be calibrated.

For instance, deposition of the semiconductor layer is initiated at a temperature of the substrate being preset at a higher temperature than the temperature Ts. Then, the temperature of the substrate is decreased and at the time when the transmittance of the light having a wavelength λs has increased, the semiconductor layer is judged to have reached the temperature Ts, and measurement error by the device for measuring temperature variations can be corrected from the temperature Td by the difference Ts-Td at the above time and the temperature Ts.

It is also possible to calibrate the temperature measurement error more than once during the deposition of the semiconductor layer if the temperature Ts is reached more than once. For example if the temperature of the substrate being preset at a higher temperature than the temperature Ts is then decreased and at some time the transmittance of the light having a wavelength λs to the semiconductor layer during the film deposition has increased, then the semiconductor layer is judged to have reached the temperature Ts. Following this if the temperature of the substrate is increased passed a second time, when the transmittance of the light having a wavelength λs increases, then the semiconductor layer is judged to have reached the temperature Ts again; and measurement errors of the device for measuring temperature variations can be calibrated from temperature measurements at these two times to the temperature Ts.

Further, the present invention can calibrate measurement error of the device for measuring temperature variations in such a way that after the deposition of the semiconductor layer, the temperature of the substrate is decreased; at the time when the transmittance of the light having a wavelength λs to the semiconductor layer has increased, the semiconductor layer is judged to have reached the temperature Ts, and measurement error can be calibrated from the temperature Td measured by the device for measuring temperature variations at the above times and the temperature Ts.

Furthermore, the present invention is characterized as a device for measuring the temperature of a semiconductor layer during or after deposition in a film depositing device which forms semiconductor layer on a substrate being heated in a chamber with source molecules supplied to that chamber, possessing a device which emits light at predetermined wavelength λs, a photo detector which detects the amount of light having a wavelength λs past the semiconductor layer, and which provides this measurement result to a controller for adjusting the substrate heating system;

the information about the relationship between the temperature Ts of the semiconductor layer and the wavelength λs at the time when the transmittance of the light past through the semiconductor layer decreases is stored in the controller during the process where the temperature of the semiconductor layer is increased with the light having a wavelength λs applied to the semiconductor layer; and while the semiconductor layer is being irradiated with light having a wavelength λs during or after the deposition, the controller judges that the semiconductor layer has reached the temperature Ts at the time when the heating system has decreased the temperature of the substrate and the amount of light having a wavelength λs detected by the photo detector has increased, or judges that the semiconductor layer has reached the temperature Ts at the time when the heating system has increased the temperature of the substrate and the amount of light having a wavelength λs detected by the photo detector has decreased.

Furthermore, the temperature measuring device by the present invention is provided with a device for continuously monitoring temperature measurement variations while heating the substrate; and the temperature Td measured at the time when the semiconductor layer is judged as having reached the temperature Ts by the device for measuring temperature variations is compared with the temperature Ts at the controller, and based on the difference obtained from the comparison, temperature measurement error of the device for measuring temperature variations is calibrated.

Advantageous Effect of the Invention

The temperature measuring method and the temperature measuring device by the present invention enable temperature measurement of the semiconductor layer by detecting the change of transmittance of the light at a predetermined wavelength λs in the semiconductor layer during or after deposition. The method by the present invention detects only the quantity of light transmitted at the time when the light with the predetermined wavelength λs passes through the semiconductor layer, not the method which measures the temperature by the quantity of light, and is therefore immune to malfunction due to measured light intensity error.

By referencing to the time at which the temperature Ts of the semiconductor layer is obtained by monitoring the transmittance change at wavelength λs, differences of temperature measurement obtained at that time from a device measuring temperature variations can be calibrated. By this method, temperature offset errors of devices for measuring temperature variations, including pyrometers can be calibrated with high precision.

The temperature calibration of devices for measuring temperature variations can be carried out during the film deposition of the semiconductor layer or even after the film deposition of the semiconductor layer, and hence a constantly self-calibrated temperature measurement becomes possible.

DESCRIPTION OF THE PREFERRED EMBODIMENTS

FIG. 1 is an explanatory drawing of the film deposition device and the temperature measuring device. FIG. 2 is a magnified explanatory drawing illustrating the substrate and semiconductor layer during deposition inside the film deposition device's chamber.

FIG. 1 shows a schematic diagram of the film deposition device 1 for a semiconductor layer by of chemical vapor deposition (CVD) or the molecular beam epitaxy (MBE) processes.

The film deposition device 1 is equipped with a chamber 2, the inside of which is maintained in reduced pressure state during film deposition. In the chamber 2, a table 3 is provided, wherein the heating system 3a is incorporated. The feed port 4 is connected to chamber 2, through which the source gas 5 including elements (source molecules) of film deposition for the semiconductor layer 7 is supplied to the surface of the table 3. The semiconductor layer 7 is deposited on the substrate 6 disposed on the table 3.

The chamber 2 is equipped with the first window 8 and the second window 9. A transparent plate such as a glass plate is put on the first window 8 and the second window 9, through which the inside can be observed. The interior space and the external space of the chamber 2 are separated by a transparent plate.

Outside of the first window 8, a pyrometer 10 is equipped as an example of the device for measuring temperature variations. The pyrometer 10 is equipped with the light detector 11 and the processing circuit 12 which processes the light output detected by the light detector 11. The light detector 11 of the pyrometer 10 is installed outside the first window 8, and is positioned above the substrate separated by the transparent plate on the first window 8. In other words, the center of the light detector 11 is positioned normal to the line Lv extending from the surface of the substrate 6 and the light detector 11 is pointing at the surface of the substrate 6 along the line Lv.

When the substrate 6 is heated on the table 3 by the heater 3a, infra-red rays emitted due to heat from the surface of the table 3, pass through the transparent substrate 6 and the semiconductor layer 7 during film deposition and are detected by the light detector 11 through the first window 8. The light output detected by the light detector 11 is sent to the processing circuit 12, and from the infra-red light detected, the surface temperature of the substrate 6, more precisely the surface temperature of the table 3 is measured.

Outside the chamber 2, the light emitting device 21 comprising the temperature measuring device 20 by the present invention is installed. The light emitting device 21, points to the surface of the substrate 6 from the outside of the second window 9 of chamber 2, emitting laser light at an almost single-frequency. Laser light from the light emitting device 21 is provided at any angle except 0 degrees and 90 degrees to the normal of the substrate surface. By inclining the path Ld at the angle θ, the light transmittance of the semiconductor layer 7 is decreased and when the laser light reflects on the surface of the semiconductor layer 7, the reflection laser light reflects in a direction other than the perpendicular line Lv, preventing the laser light reflected on the surface of the semiconductor layer 7 from entering straight the light detector 11.

The substrate 6 is a wafer composed of transparent materials such as sapphire. In this context, the "transparent" means as having the optical property of the total light transmittance at 80% or above, more preferably 95% or above. As FIG. 2 illustrates, the bottom face 6a of the substrate 6 is provided with roughness for diffused reflection. When the light transmittance of the semiconductor layer 7 is high, the laser light irradiated along the path Ld passes through the semiconductor layer 7 and through the substrate 6, and is reflected diffusely from the bottom surface 6a. Some of the diffused laser light permeates back through the substrate 6 and the semiconductor layer 7, and the component along the perpendicular line Lv is detected by the light detector 11.

In the pyrometry device 10, a light detector 11 is used to detect infra-red and also used as a photo detector to detect laser light diffused from the bottom surface 6a. The light detector 11 is configured in such a manner that the detection of the infra-red rays emitted from heating of the substrate 6 and the detection of the laser light emitted from the light emitting device 20 are made alternately in time so that the detection of infra-red rays from the heat radiation, direct reflection and the detection of diffused laser light do not interfere with each other. Besides the light detector 11 of the pyrometry device 10 to detect the infra-red rays, it is possible to provide a photo detector to detect laser light and arrange the light detector 11 and the photo detector outside the first window 8.

As shown in FIG. 1, the film depositing device 1, the pyrometry device 10 and the light emitting device 20 are controlled by a central controller 30. The central controller 30 is composed of such elements as the microcomputer and memories. The heating controller 31, receiving an instruction from the central controller 30, controls electric supply to the heater 3a, by which the heating temperature of the table 3 is controlled. The laser light emitting controller 32 controls the light emitting device 20, receiving instructions from the central controller 30.

The detection output of the pyrometer 10 is supplied to the temperature detector 33. The detection output of the infra-red rays emitted from the table 3 is detected by the temperature detector 33, the surface temperature of the table 3 is obtained from the heat emitted infra-red light, and the temperature information is fed to the central controller 30. The laser light diffused from the bottom surface 6a of the substrate 6 is detected by the light detector 11, the detection output relating to the amount of light detected is fed to the temperature detector 33 and the information is notified to the central controller 30.

The following explains the temperature measuring method applying the temperature measuring device 20. A monochromatic light with wavelength λs is emitted from the light emitting device 21. The relationship between the wavelength λs and the transmittance of the semiconductor layer during or after film deposition, and the relationship between the wavelength λs and the temperature of the semiconductor layer are shown in FIG. 3 (A)(B).

The semiconductor layer 7 which is deposited on the surface of the substrate 6 contains layers of semiconductor materials such as AlN, GaAs, GaN, InP, Si, or SiC to form device structures such as light emitting diodes or others. The transmittance of the light through the semiconductor layer is dependent on the wavelength and the temperature.

FIG. 3 (A) shows the transmittance characteristic of a semiconductor layer, stressing the features that when the wavelength λx of the light irradiated extends beyond the wavelength of the band edge, the light transmittance becomes high and when the wavelength λx of the light is shorter than the wavelength of the band edge, the light transmittance becomes low. At the band edge, the light transmittance changes dramatically. The wavelength of the band edge varies with temperature, even for the same semiconductor layer. In FIG. 3 (A), schematic temperature dependence of the semiconductor layer transmittance characteristic are shown by T1 to T6, where T1<T2<T3<T4<T5<T6. Even for the same semiconductor layer, if the temperature becomes higher, the wavelength of band edge, which shows as a sharp change in light transmittance, shifts toward the long wavelength region.

FIG. 3 (B) gives the relationship between the wavelength of the semiconductor material band edge and the temperature of the semiconductor layer. The example in FIG. 3 (A) (B) shows that when the temperature of the semiconductor layer is T1, the wavelength λx of the band edge is 450 nm. Accordingly, if the wavelength of the light incident on semiconductor with temperature T1 is shorter than 450 nm, the light transmittance is low, and if the incident light wavelength is longer than 450 nm then the transmittance is high. When the temperature of the semiconductor layer is T2, the wavelength of the band edge is 480 nm. Accordingly, when the wavelength of the light incident the semiconductor layer with the temperature T2 is shorter than 480 nm, the light transmittance is low, and when the light transmittance is high for light of wavelength which exceeds 480 nm.

FIG. 3 (A) (B) show a typical example of the relationship between the temperature of the semiconductor layer and the wavelength of band edge. In the actual cases of semiconductor layers including AlN, GaAs, GaN, InP, Si, and SiC, each has its own relationship between the temperature and the band edge. Although the relationship between the temperature and the band edge wavelength for individual semiconductor layers is already known in most cases, it is preferable to conduct experiments to obtain data such as shown in FIG. 3 (A) (B), and to obtain the relationship of the temperature vs. the wavelength of band edge for the semiconductor layer to be deposited.

FIG. 4 shows the variation of temperature curve (a) of the semiconductor layer 7 during deposition or right after deposition as function of deposition time. In order to achieve film deposition at a constant rate with reproducibility for intrinsic semiconductor layers, the temperature control of the semiconductor layer 7 during the film deposition is extremely important. In curve (a) of FIG. 4, the suitable temperature for film deposition of the semiconductor layer 7 is specified to be 900 deg. C.

As shown in FIG. 3 (A) (B), the semiconductor layer 7 to be deposited has its own relationship between the temperature and the wavelength of band edge. In the case of the example shown in FIG. 3 (A) (B), the wavelength λs of the semiconductor band edge is 480 nm when the temperature Ts of the semiconductor layer is 800 degrees Celsius. FIG. 4 explains the process of the film deposition for the semiconductor layer with material properties shown in FIG. 3, and for which the wavelength of the laser light from the light emitting device 21 is selected as λs=480 nm. When the band edge wavelength is at λs (480 nm), the temperature Ts of the semiconductor layer is 800 degrees. Logically, the temperature Ts must be lower than the deposition temperature (900 degrees), which is considered a suitable temperature for film deposition as shown by graph (a) in FIG. 4. In other words, it is necessary to select the light emitting device 21 to emit laser light having a wavelength λs which matches the band edge wavelength at a temperature Ts which is lower than the temperature of film deposition.

As shown in FIG. 2, the laser light having a wavelength λs incident along the path Ld penetrates the semiconductor layer 7 and the substrate 6, then reflects on the rough bottom surface 6a of the substrate 6. Diffused laser light reflects back through the substrate 6 and the semiconductor layer 7, and some light components are detected by the light detector 11 along the perpendicular line Lv. In FIG. 4, the amount of laser light having a wavelength λs detected by the light detector 11 is indicated by curve (b). In curve (b), the y-axis indicates of the amount of light. Also superimposed in FIG. 4 is the change in the film thickness of the semiconductor layer 7 during deposition on the substrate 6 shown as curve (c). In curve (c), the y-axis indicates relative film thickness.

In the deposition process shown by FIG. 4, the period (i) is the initial state, in which the table 3 is not yet heated nor has the source gas 5 been introduced. The central controller 30 manages the heater controller 31 to heat the table 3 and the substrate 6 via heater 3a in period (ii), and in period (iii), the substrate 6 is heated to around 900 degrees Celsius. At this time, infra-red rays from the surface of the heated substrate 6 are detected by the light detector 11 of the pyrometry device 10, and temperature information is sent from the temperature detector 33 to the central controller 30. At this point of time, the central controller 30 controls the heating controller 31 to keep the temperature of the substrate 6 at around 900 degrees, based on the temperature information measured at the pyrometry device 10.

As known from the result of curve (b), the semiconductor layer 7 has not yet been deposited on the surface of the substrate 6 in the periods (i) and (ii), and the laser light having a wavelength λs emitted from the light emitting device 21 and diffused at the bottom face 6a of the substrate 6 is detected at the light detector 11, and the amount of laser light detected by the light detector 11 has not yet decreased.

As shown by curve (c) in the period (iii), at which the surface temperature of the substrate 6 is presumed to be around 900 degrees Celsius, the source gas 5 is supplied to the chamber 2. As the result, the semiconductor layer 7 begins to be deposited on the surface of the substrate 6, as indicated by (x) on curve (c). At the time when the semiconductor layer 7 begins to be deposited, the temperature of the semiconductor layer 7 is around 900 degrees, or at least higher than the temperature Ts shown in FIG. 3 (B), and therefore, the semiconductor layer 7 light transmittance is low for light having a wavelength λs. Because of this, the amount of diffused laser light detected by the light detector 11 decreases as indicated by (xi) on curve (b).

In period (iv) in succession to period (iii), the heating controller 31 stops feeding power to the heater 3a to lower the temperature of the table 3. As shown in curve (a) during period (iv), the temperature of the substrate 6 and the semiconductor layer 7 lower in following the decrease in temperature of the table 3. In the period (iv), at the time A when the temperature of the semiconductor layer 7 equals temperature Ts, the wavelength of band edge of the semiconductor layer 7 coincides with the wavelength λs of the laser light from the light emitting device 21. Therefore, at time A, the transmittance to the light having a wavelength λs of the semiconductor layer 7 in the process of film deposition sharply increases, and as indicated by (xii) on curve (b), the amount of light at the light detector 11 sharply increases.

The change of light output of the light detector 11 is sent to the central controller 30 via the temperature detector 33. The central controller 30 judges, at the time A when a sudden increase of the amount of laser light having a wavelength λs is known, that the temperature of the semiconductor layer 7 is Ts (800 deg. C).

In period (v), the heating controller 31 supplies the heater 3a with electricity to resume heating of the table 3. Simultaneously, the temperatures of the substrate 6 and the semiconductor layer 7 start to rise. At time B, the temperature of the semiconductor layer 7 reaches temperature Ts again, and the light transmittance at wavelength λs in the semiconductor layer 7 sharply decreases. As shown by (xiii) of curve (b), the amount of light at the light detector 11 sharply decreases. The central controller 30 judges, at the time B when a sudden decrease of the amount of laser light having a wavelength λs is detected, that the temperature of the semiconductor layer 7 is Ts (800 deg. C).

At times A and B, the status that the temperature of the semiconductor layer 7 in the process of deposition has become Ts (800 deg. C) can be directly detected from the temperature of the semiconductor layer 7 itself, and therefore, utilizing this information, the central controller 30 is able to perform temperature control of the semiconductor layer 7 more accurately in the following operations.

As shown in FIG. 1, in the present embodiments, the pyrometer 10 is provided to detect heat-generated infra-red rays emitted from the surfaces of the substrate 6 and the semiconductor layer 7, and the pyrometer 10 is used as a device to measure temperature changes, which monitors heating temperature of the substrate 6 and the semiconductor layer 7, continuously. The connotation of "continuously" applied herein is a concept to include the status that at the light detector 11, the time to detect infra-red rays and the time to detect the amount of laser light having a wavelength λs are repeated alternately; that is, to include the case that the temperature information is obtained by intermittent detection of infra-red rays at the pyrometer 10.

Accordingly, by comparing in the central controller 30, the information of the temperature Td detected at the pyrometer 10 at the time A and the temperature Ts(800 deg. C), error in temperature information detected from receiving infra-red rays at the pyrometer 10 can be measured, and at the central controller 30, it is possible for the temperature information of the pyrometer 10 sent from the temperature detector 33 to be calibrated to the information close to the actual temperature of the semiconductor layer 7. For this calibration, either one of the information at the time A or the information at the time B can be used, but by using the both information of the time A and the time B, a higher precision of calibration is realized for the temperature information obtained from the pyrometer 10.

As shown by curve (a) of FIG. 4, in period (vi) in succession to period (v), it is necessary for the temperature of the semiconductor layer 7 to be maintained at a constant temperature (900 deg. C), which is suitable for film deposition. In period (vi), the temperature information obtained from the pyrometer 10 has been calibrated before the use with the information of the temperature Ts obtained at the time A and the time B. Because of this, in the period (vi), it is possible to control the temperature of the semiconductor layer 7 during deposition, with high accuracy, and constantly, at 900 deg. C or extremely close to 900 deg. C by controlling the heating controller 31 based on temperature information from the pyrometer 10.

Accordingly, as shown by (xiv) of curve (c) in FIG. 4, in period (vi), the semiconductor layer 7 can be formed at a constant deposition rate.

As shown in FIG. 4, after the start of the semiconductor layer 7 deposition, it is possible to know, with high precision, the time at which the temperature of the semiconductor layer 7 has reached Ts (800 deg. C) through a lowering and raising of the table 3 temperature by the heater 3a. Based on the information, the temperature Td measured by the pyrometer 10 can be calibrated. Accordingly, once the information by the pyrometer 10 is calibrated by conducting a temperature drop and rise process such as in periods (iv) and (v), the semiconductor layer 7 can be deposited at a reproducible rate based on the temperature information from the pyrometer 10, without constantly requiring further temperature drop and rise processes.

Thus, the calibration of the temperature information from the pyrometer 10 can be made by performing a heating change such as periods (iv) and (v) only as needed.

Also, even without performing a heating change such as periods (iv) and (v), it is possible to obtain the calibration information when the semiconductor layer 7 reached Ts (800 deg.C) after the film deposition of the semiconductor layer 7.

As shown in FIG. 4, the deposition operation of the semiconductor layer 7 is terminated at the time when the film thickness is predicted to have reached the predetermined value in the period (vi), and heating by the heater 3a completes following this in period (vii). At that time, the temperatures of the substrate 6 and the semiconductor layer 7 after the film deposition will decrease and at time C when the temperature reaches Ts (800 deg. C), the light transmittance of the semiconductor layer 7 will sharply rise, and the amount of light having a wavelength λs detected by the light detector 11 will suddenly increase, as shown by (xv) of curve (b). By this increase, it can be known that the temperature of the semiconductor layer 7 has reached Ts (800 deg. C).

For instance, at time C, the pyrometer 10 can be calibrated to the semiconductor layer 7 temperature from knowing the difference between temperature Td obtained from the pyrometer 10 and Ts (800 deg. C).

In other words, even without performing temperature change processes such as in the periods (iv)(v) during the film deposition, once a film is deposited for the semiconductor layer 7, accurate information of the temperature Ts (800 deg.C) can be obtained at time C soon after the deposition. Once the temperature of the pyrometer 10 is calibrated based on this information, temperature control of the substrate 6 and the semiconductor layer 7 can be performed accurately, utilizing the temperature information from the pyrometer 10.

Meanwhile, when the light transmittance at wavelength λs through the semiconductor layer 7 decreases largely, as at (xi) in curve (b) of FIG. 4, the laser light tends to still reflect on the surface of the semiconductor layer 7. However, as shown in FIG. 2, the laser light having a wavelength λs from the light emitting device 21 goes to the semiconductor layer 7 along the path Ld which makes an angle θ with the normal line Lv, and therefore, the light reflected on the surface of the semiconductor layer 7 will not be directed at the light detector 11. Accordingly, the background signal caused by the laser light reflected on the surface of the semiconductor layer 7 is hardly changes the amount of laser light detected by the light detector 11.

In the present embodiment, the laser light having a wavelength λs is irradiated to the semiconductor layer 7 diagonally from above. Instead of this, however, it is also possible that the laser light having a wavelength λs be irradiated from under the substrate 6, the laser light pass through the substrate 6 and the semiconductor layer 7 to be detected by the light detector 11.

Figure 1:
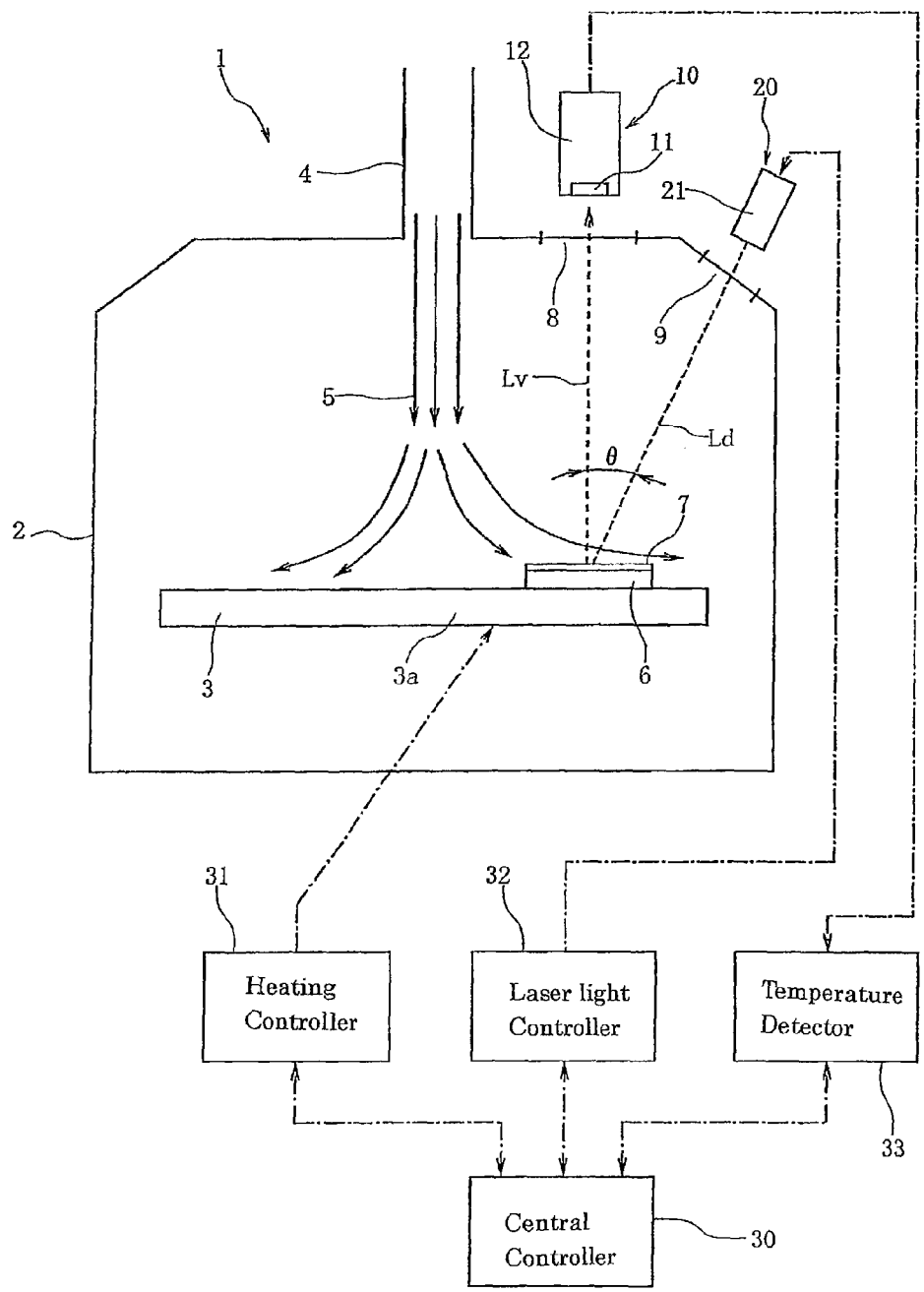
FIG. 1 A schematic drawing outlining the film depositing device and the temperature measuring device FIG. 2 An enlarged schematic of the substrate and the semiconductor layer during or after deposition, arranged in the film depositing device FIG. 3 A diagram showing the relationship between the wavelengths of light applied to the semiconductor layer, the light transmittance and the temperature of the semiconductor layer; also shown is the relationship between the temperature and the band edge wavelength of the semiconductor.
Figure 2:
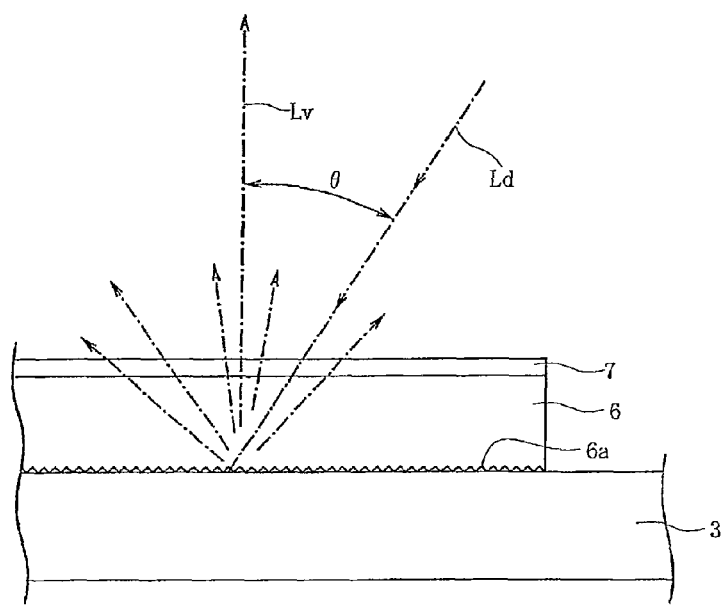
Figure 3:
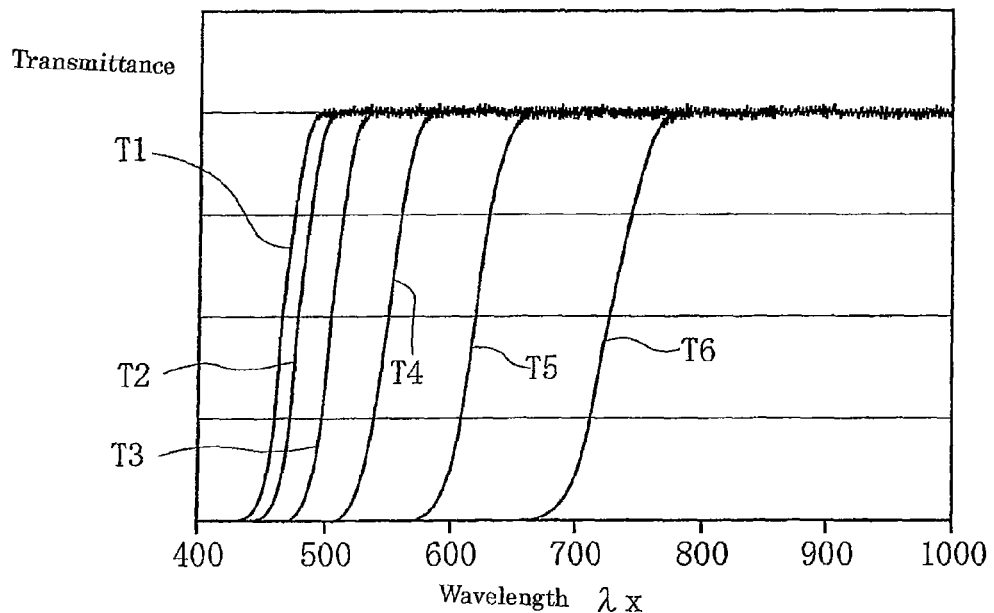
Figure 3:
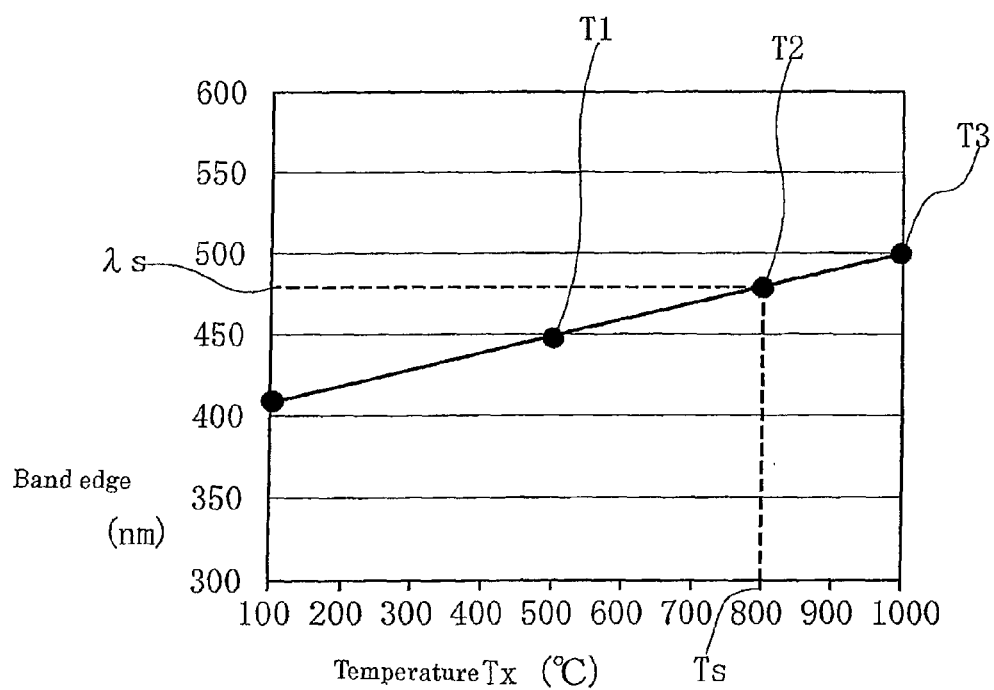
Figure 4:
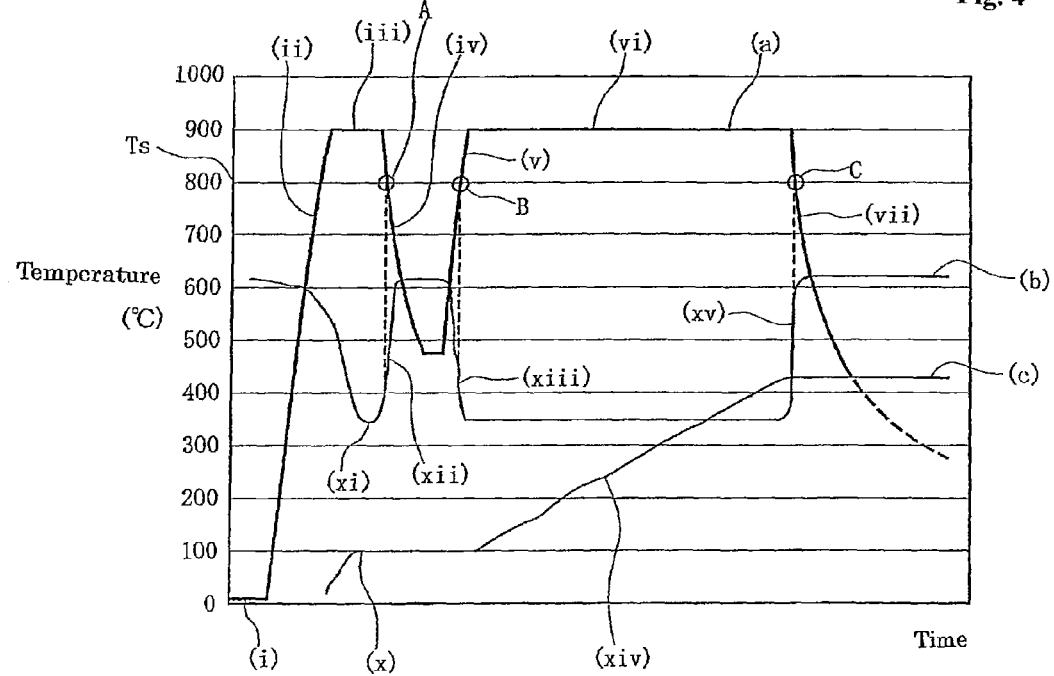
FIG. 4 A diagram showing an example of a film deposition process and the temperature measuring method of the semiconductor layer

REFERENCE SIGNS LIST 1 film depositing device
2 chamber
3 table
6 substrate
7 semiconductor layer
8 the first window
9 the second window
10 pyrometer
11 light detector
20 temperature measuring device
21 light emitting device

I claim:

1. A method for measuring a temperature of a semiconductor layer during or after deposition which is formed on a substrate being heated in a chamber with source molecules supplied to the chamber, comprising:

determining the relationship between the temperature Ts of the semiconductor layer and the decrease of light transmittance of wavelength λs, in the process of raising the temperature of the semiconductor layer with light applied to the semiconductor layer, irradiating the semiconductor layer, during or after deposition, with light of wavelength λs, and determining that the semiconductor layer has reached a temperature Ts when one of: the temperature of the substrate decreases and the transmittance of the light of wavelength λs in the semiconductor layer increases; or the temperature of the substrate increases and the transmittance of the light of wavelength λs in the semiconductor layer decreases;

wherein a device for continuously measuring temperature variations of the substrate is used and the temperature Td measured by this device is compared with the temperature Ts at the time when the temperature of the semiconductor layer is judged to have reached temperature Ts, and based on the difference, measurement error by the device for measuring temperature variations is calibrated, and wherein the deposition of the semiconductor layer is initiated with a substrate temperature preset at a higher temperature than temperature Ts; then upon decrease of the substrate temperature; and at the time when the transmittance of light of wavelength λs increases in the semiconductor layer, the semiconductor layer is judged to have reached temperature Ts; and temperature measurement error of the device for measuring temperature variations is calibrated using the difference between temperatures Td measured by the device for measuring temperature variations at the above time, and temperature Ts.

2. The method according to claim 1, wherein the deposition of the semiconductor layer is initiated with a substrate temperature preset at a higher temperature than temperature Ts; then upon decrease of the substrate temperature; and at the first time when the transmittance of light of wavelength λs increases in the semiconductor layer, the semiconductor layer is judged to have reached temperature Ts; then, the temperature of the substrate is increased; and at the second time when the transmittance of light of wavelength λs increases in the semiconductor layer, the semiconductor layer is judged to have reached temperature Ts; and temperature measurement error of the device for measuring temperature variations is calibrated twice using the difference between temperatures Td measured by the device for measuring temperature variations the first and the second time, and temperature Ts.

3. The method according to claim 1, wherein after completion of the deposition of the semiconductor layer, the temperature of the substrate is decreased; at the time when the transmittance of light having wavelength λs increases in the semiconductor layer, the semiconductor layer is judged to have reached temperature Ts, and temperature measurement error of the device for measuring temperature variations is calibrated using the difference between temperatures Td measured by the device for measuring temperature variations at the above time, and temperature Ts.

* * * * *